(12) United States Patent
Constable et al.

(10) Patent No.: US 9,229,081 B2
(45) Date of Patent: Jan. 5, 2016

(54) ACCELERATED MRI WITH NONLINEAR SPATIAL ENCODING GRADIENTS

(75) Inventors: Robert T. Constable, Madison, CT (US); Jason Stockmann, Somerville, MA (US); Lick-Kong Tam, New Haven, CT (US); Gigi Galiana, New Haven, CT (US)

(73) Assignee: Yale University, New Haven, CT (US)

( * ) Notice: Subject to any disclaimer, the term of this patent is extended or adjusted under 35 U.S.C. 154(b) by 721 days.

(21) Appl. No.: 13/518,096

(22) PCT Filed: Dec. 22, 2010

(86) PCT No.: PCT/US2010/061826
§ 371 (c)(1),
(2), (4) Date: Jun. 21, 2012

(87) PCT Pub. No.: WO2011/087847
PCT Pub. Date: Jul. 21, 2011

(65) Prior Publication Data
US 2012/0286783 A1    Nov. 15, 2012

(51) Int. Cl.
*G01V 3/00*     (2006.01)
*G01R 33/561*   (2006.01)
*G01R 33/385*   (2006.01)

(52) U.S. Cl.
CPC .......... *G01R 33/5611* (2013.01); *G01R 33/385* (2013.01)

(58) Field of Classification Search
CPC .......... G01R 33/34007; G01R 33/422; G01R 33/3657; G01R 33/5611; H01Q 1/526; H01Q 17/002
USPC ......................................... 324/309, 307, 306
See application file for complete search history.

(56) References Cited

U.S. PATENT DOCUMENTS

| 8,354,844 B2 * | 1/2013 | Zaitsev et al. | 324/307 |
| 8,710,839 B2 * | 4/2014 | Constable et al. | 324/309 |
| 8,754,645 B2 * | 6/2014 | Gross et al. | 324/309 |

OTHER PUBLICATIONS

Ohlinger et Sodickson, An introduction to coil array design for parallel MRI, 2006, NMR in Biomedicine, 19: 300-315.*

* cited by examiner

*Primary Examiner* — Louis Arana
(74) *Attorney, Agent, or Firm* — Lumen Patent Firm

(57) ABSTRACT

In a method of magnetic resonance imaging, a set of nonlinear, mutually orthogonal magnetic gradient encoding fields are sequentially and separately generated in an imaging region [100]. Using multiple receiver coils having nonuniform sensitivity profiles, echo data representing signal intensities in the imaging region is sequentially acquired as the magnetic gradient encoding fields are sequentially generated [102]. A reconstructed image of the imaging region is computed from the acquired echo data [104], and the reconstructed image is then be stored and/or displayed on a display monitor [106].

7 Claims, 3 Drawing Sheets

ACCELERATED MRI WITH NONLINEAR SPATIAL ENCODING GRADIENTS

CROSS-REFERENCE TO RELATED APPLICATIONS

This application is a 371 of PCT patent application PCT/US2010/061826 filed Dec. 22, 2010, which claims the benefit of US Provisional Application 61/289,044 filed Dec. 22, 2009.

FIELD OF THE INVENTION

The invention relates generally to medical imaging devices and techniques. More specifically, it relates to improved techniques for parallel magnetic resonance imaging.

BACKGROUND OF THE INVENTION

Magnetic resonance imaging (MRI) is a medical imaging technique based on the phenomenon of nuclear magnetic resonance (NMR). In contrast with medical imaging techniques using x-rays, MRI is capable of producing high resolution images for a variety of applications and anatomies without using ionizing radiation. Typically, a MRI scan is initiated by generating a strong magnetic field which aligns the magnetic moments of protons (i.e., the nuclei of hydrogen atoms) in the volume of interest being scanned. A radiofrequency (RF) pulse is then transmitted into the volume of interest. If the frequency of the RF pulse matches the Larmor frequency of protons in the volume, the pulse may induce a spin-flip transition of the protons from an aligned state to a higher-energy anti-aligned state. When the protons relax after the pulse, they will then emit RF signals at the Larmor frequency which can be detected with receiver coils. The intensity of the detected signal is representative of the concentration of protons in the volume.

The Larmor frequency of a proton is proportional to the strength of the magnetic field. Consequently, if the applied magnetic field is generated with a known spatial gradient, then the Larmor frequency of protons will also have a known spatial localization. Because the frequencies of the detected RF signals from the relaxing protons are known (i.e., the signal data is measured in the frequency domain, or k-space), and because these frequencies are correlated with spatial locations through the known magnetic gradient field, the signal can be transformed from the frequency domain to the spatial domain to produce an image. Because the gradient field provides the correlation between the frequency domain and image domain, it is sometimes called an encoding field.

Conventionally, several orthogonal linear gradients are used in MRI, and several repetition times (TRs) are needed to gather sufficient information to reconstruct an image of the volume. Thus, conventional MRI requires relatively long scan times. Consequently, researchers have developed various techniques in attempt to reduce scan times. For example, one recent advance in MRI, known as parallel imaging, involves acquiring signals simultaneously with multiple receive coils. The acquired data can be under-sampled and the resulting aliasing can be unwrapped using receiver coil sensitivity information to produce full images.

Generally, parallel imaging methods combine spatially-weighted data from multiple simultaneous measurements in order to reduce scan time. Most parallel imaging approaches collect a reduced data set for later interpolation for a Fourier or algebraic reconstruction. By relying on the Fourier reconstruction approach, conventional approaches use orthogonal gradients that complement each other. These gradients, however, can be inefficient with regards to information gathered from the coil sensitivities, resulting in longer scan times and/or reduced image resolution.

For an N×N image, a classic fully-sampled linear gradient data collection scheme requires N repetitions of the basic procedure to generate N lines of k-space. During each repetition time, linear magnetic gradients create plane-wave oscillations in the phase across the image. As the phase variation replicates the kernel of the Fourier transform, the k-space data set is reconstructed via the fast Fourier transform (FFT). When k-space lines are undersampled, aliasing occurs as image fold over.

Conventionally, parallel reconstruction operates on an undersampled frequency domain data set, and data sets from separate coils are either combined in the k-space domain, in the image domain, or a hybrid space. GRAPPA, SENSE, and SMASH exemplify three known approaches within a Fourier acquisition scheme using linear magnetic gradients for signal encoding. SMASH uses linear combinations of coil sensitivity profiles as a free parameter to shift existing k-space lines to fit omitted data. In order to shift k-space lines, linear combinations of coil profiles must approximate spatially oscillating functions. In practice, coil sensitivity profiles are slowly varying and spatially distinct. The limited flexibility in changing coil profiles makes implementation on an anatomy-constrained geometry difficult.

In another approach to reducing scan time, some research has aimed to modify receive coils, allowing for less data collection and better unwrapping of the aliasing artifacts. This research has focused on increasing the number of receive coils to localize the sensitivity, only to face issues of ballooning cost and diminishing returns. Recent hardware advances used up to 96 receive coil elements. Hardware costs increase dramatically with the number of coils since each coil must use a separate receiver, cabling, pre-amplifier, and so on. The difficulty of constructing large coil arrays is nontrivial as elements must be de-coupled. Nearest neighbor approaches through overlapping coils and pre-amplifier decoupling partially addresses inductive coupling of numerous further elements. Increasing coil number reduces the g-factor, a pixel by pixel measure of noise amplification, but drives the cost much higher. Moving to higher fields and including spatially selective parallel transmission pulses show promise, but fundamentally does not address the underlying encoding problem.

Improvements have been made in SENSE and GRAPPA reconstructions to preserve reconstruction quality, but these penalize acceleration in image acquisition. There has been a trend towards auto-calibration, which has been adopted by SENSE/SMASH as generalized SENSE/SMASH (GSENSE/GSMASH). Another generalization is the expansion of data sampling trajectories to radial and spiral k-space trajectories. For example in radial k-space sampling, an auto-calibration scan (ACS) is collected near the center of k-space during each readout. Using auto-calibration improves image quality at the expense of imaging time by requiring more data collected, or introduces bias by emphasizing low spatial frequency components of the image.

Though sharing a frequency and phase acquisition scheme with Cartesian data, PatLoc (parallel imaging technique with local gradients) performs orthogonal gradients imaging with nonlinear gradients. Non-bijective curvilinear gradients enable faster gradient switching through dB/dt reduction. PatLoc reconstruction relies on the local orthogonality in the magnetic fields to apply a volumetric correction term to the integrand of the signal integral. With the volumetric correction, the image is reconstructed using a fast Fourier transform (FFT). Limiting gradients to a pair-wise orthogonal multipolar gradient set causes position dependent resolution, with a noticeable absence of signal localization in the center of the image. To date, higher-order gradient encoding has only been performed using custom-built gradient coils.

SUMMARY OF THE INVENTION

In one aspect, the invention provides an improved technique for magnetic resonance imaging. Scan times are reduced by using gradient encoding fields that are complementary to the spatial encoding abilities of one or more receivers. By providing complementary spatial information with gradients (frequency encoding), high quality images may be created in fractions of the time of conventional accelerated imaging methods. Alternatively, the technique allows obtaining higher quality images in an equal amount of time with targeted spatial localization. Moreover, the complementary gradients may be achieved using modifications of well-characterized magnetic fields.

A parallel magnetic resonance tomography apparatus according to one aspect of the invention includes magnets for generating within a volume of interest predetermined spatially-varying magnetic fields, known as gradients or encoding fields, and multiple receiver coils for detecting RF signals from within the volume of interest. The gradients are specifically designed complementary to sensitivity profiles of the receiver coils. The apparatus uses physically realizable magnetic gradients to approximate ideal complementary gradient shapes. The magnetic gradients are crucial to the data collection process and represent a choice in the information collected for each segment of the scan. The apparatus also may comprise RF pulse generation coils, signal acquisition circuitry, a computer for reconstructing an image from the acquired signals, and a display for displaying the reconstructed image.

The known spatial encoding capability of a given array of receiver coils is used to select specific gradient encoding fields that provide spatial encoding complementary to the array. Representing the signal acquisition process as a linear transformation allows the determination of the specific complementary spatial encoding gradients that will capture the spatial information omitted by the receiver coil array. For example, singular value decomposition (SVD) of a coil spatial sensitivity matrix may be used to determine the set of orthogonal magnetic field gradients complementary to the receiver coil profiles. This technique treats the set of orthogonal gradients as a linear transformation on the image. A subsequent SVD may be used to identify an efficient set of gradients providing a desired amount of resolution or acceleration. The efficient gradients are then used in MRI data acquisition and allow the signals to be spatially localized and hence reconstructed into an image.

In one aspect, the present invention provides a method of parallel magnetic resonance imaging. The method includes sequentially and separately generating magnetic gradient encoding fields in an imaging region. The magnetic gradient encoding fields are mutually orthogonal nonlinear spatial gradient fields that are solutions to the Laplace equation. In addition, the magnetic gradient encoding fields approximate ideal gradient field shapes that are optimally complementary to the spatial information provided by the receiver coil sensitivity profiles. More specifically, the ideal gradient field shapes optimally encode information residing in the null space of the coil sensitivity profiles. In this context, the term optimal encoding means that the gradient shapes provide maximally complementary spatial information relative to the receiver coils such that a minimum number of views are required (i.e., providing maximum acceleration) to reconstruct an artifact-free image. The selected gradient shapes produce images with fewer distortions than any other equivalently-size set of spatial encoding gradients. Suboptimal gradients in this context are those that provide redundant spatial information and thus waste acquisition time. The magnetic gradient encoding fields may be, for example, combinations of spherical harmonic functions or free disk harmonic functions that are a least-squares approximation to the ideal gradient fields. Free disk harmonics are solution to Laplace's equation over a cylindrical volume.

The method further includes, in correspondence with the sequentially generating the magnetic gradient encoding fields, sequentially acquiring echo data representing signal intensities in an imaging region. Multiple receiver coils are used to simultaneously acquire the echo data at each instant in time. The multiple receiver coils have corresponding nonuniform receiver coil sensitivity profiles that the gradient fields are designed to complement.

The method also includes computing a reconstructed image from the acquired echo data. For example, the reconstructed image may be computed using a set of linear equations relating the receiver coil sensitivity profiles, the magnetic gradient encoding fields, and acquired echo data. The reconstructed image may be computed, for example, using an algebraic reconstruction technique, conjugate gradient algorithms, or Fourier reconstruction techniques. The reconstructed image may then be stored and/or displayed on a display monitor.

DETAILED DESCRIPTION

Figure 1:
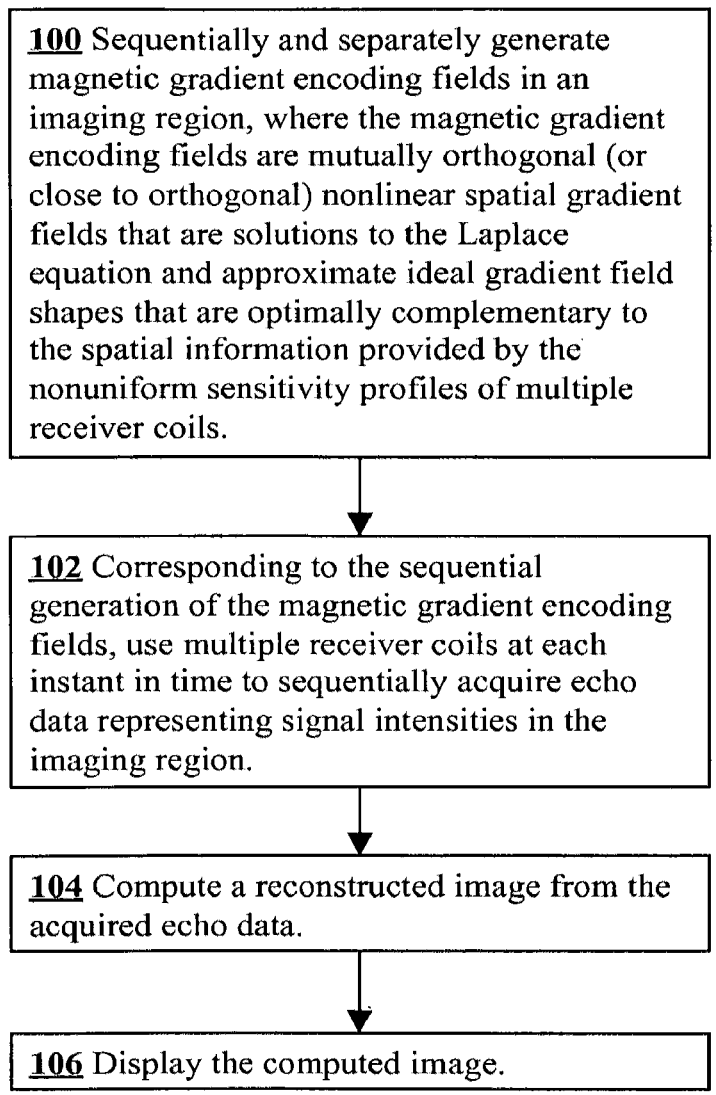
FIG. 1 is a flowchart outlining key aspects of a method for MRI according to an embodiment of the invention.

MRI uses spatially-varying magnetic fields, termed gradients, in order to spatially localize signals. Fundamentally, imaging differs from spectroscopy through the use of gradients that assign different frequency codes to separate spatial regions in the area to be imaged. The Larmor precession equation states that the frequency of the RF signal is proportional to the magnetic field intensity. Much of the art involved in faster methods of image acquisition have focused on efficient methods and apparatuses to encode and localize signals with gradients. The approach of the present invention is to design the gradients to complement the performance of the receiver coils.

Conventional gradients use magnetic fields that increase linearly with position in x, y, or z directions. Some known gradient systems use orthogonal gradients that are nonlinear, but these have been designed through the principle of reducing magnetic field variation, without regard for receiver coil performance. The approach of the present invention is to leverage the flexibility in gradient shapes to complement receiver sensitivity. The set of NSI gradients designed is orthogonal and can be used without multichannel receiver coils.

Embodiments of the present invention provide improved MRI techniques using nonlinear magnetic field gradients that are designed to complement receive coil localization, thereby allowing for efficient data acquisition that is robust under high acceleration factors. Previously, nonlinear gradients have not been designed to efficiently encode spatial information in MRI.

While previous methods to accelerate data acquisition increase the number of receiver coils without consideration to how the receiver coil and magnetic field gradients interact, embodiments of the present invention use a gradient encoding scheme to complement the receiver coil geometry. Nonlinear magnetic gradient fields complementary to receive coil sensitivity information encode more data in less time than linear gradients, thereby allowing accelerated imaging.

Null space imaging (NSI) advantageously uses the coil array encoding to improve MRI. The coil array spatial encoding is represented as individual coil sensitivity which decreases as distance from the coil increases. However, coil sensitivity spatial encoding has limited localization, as the coil sensitivity coils are broad and overlap considerably. According to the present invention, NSI gradient encoding shares the burden of spatial localization.

The principle of sharing encoding duties between receive coils and encoding functions may be formalized with the mathematics of linear transformations. Particularly, the singular value decomposition (SVD), which provides the range space and null space of a transformation, determines the information supplied and omitted by a gradient application. Gradient encoding functions act to encode the space that is ill-described by the coil array.

Physically realizable magnetic encoding function shapes are limited to solutions to Laplace's equation. Consequently, combinations of spherical harmonics may be used to approximate ideal encoding function shapes. Nonlinear encoding functions composed of spherical harmonics through second order provide an efficient and novel image acquisition method.

Thus, in a method according to one embodiment of the invention, spherical harmonics are used to approximate desired optimal fields. Representing a small subset of the possible set of spherical harmonics, a gradient system with first and second order spherical harmonics can be used in modified gradient echo and spin echo sequences to provide enhanced acceleration of MRI data acquisition in the context of parallel imaging. Null space imaging (NSI) gradient encoding enables rapid and efficient image acquisition.

Spherical harmonics are well-characterized fields with a knowledge base from implementation in shimming. Compared to conventional parallel imaging, a set of gradients complementary to receiver coil profiles allow for the elimination of phase encoding and acquire data instead using a set of complementary nonlinear readout gradients, where a different gradient from the set is used for each echo.

Instead of phase encoding, different nonlinear gradient fields may be applied as readout gradients that maximize the complementary encoding content of both the previously applied field gradients and the information provided by the coil sensitivity profiles. A small set of gradient fields can be used that ultimately encode the entire region of interest in an optimal fashion. With this approach very high acceleration factors are achievable.

FIG. 1 provides an outline of the main aspects of a method of MRI according to one embodiment of the invention. In step 100, a set of magnetic gradient encoding fields are sequentially and separately generated in an imaging region. The magnetic gradient encoding fields are mutually orthogonal nonlinear spatial gradient fields that are solutions to the Laplace equation. In step 102, echo data representing signal intensities in an imaging region is sequentially acquired as the magnetic gradient encoding fields are sequentially generated, so that echo data is acquired simultaneously by multiple receiver coils during the generation of each gradient field in the set of gradient fields. The gradient fields are designed complementary to nonuniform sensitivity profiles of the receiver coils. In step 104, a reconstructed image of the imaging region is computed from the acquired echo data, and in step 106 the reconstructed image is then be stored and/or displayed on a display monitor. A set of linear equations relating the coil profiles, the spatial encoding gradients, and the signal intensities received by each coil can be used to reconstruct a complete image.

This can be done directly from the raw data using an algebraic reconstruction technique, or, for certain gradient encoding profiles a modified-Fourier Transform can be performed on the echo, projecting the image onto the ring profiles followed by a linear systems approach, least squares for example, to reconstruct the final image.

The gradients may be applied with dephase and rephase lobes as in conventional Fourier based NMR and the echo that is acquired in the presence of a non-linear readout gradient represents a projection of the image onto the gradient equipotential lines. In the case of a Z-squared encoding function, one of many that can be applied, the image is projected onto a set of concentric rings and a modified Fourier transform yields an intensity for each ring (frequency band) with the intensity of the ring representing the integration of the object signal along that ring.

This nonlinear gradient encoding approach provides further acceleration in parallel imaging. Instead of resorting to the brute force approach of using more and more receive coils, acceleration is provided primarily by changing the conventional 2D orthogonal linear gradient encoding used with 2D and 3D NMR to an encoding scheme that is directly takes into consideration the spatial information provided by the receiver coils and is thus much more efficient.

Figure 2A:
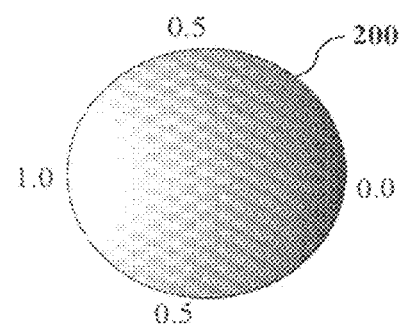
FIGS. 2A and 2B illustrate a coil sensitivity profile and a corresponding map of isocontours according to an embodiment of the invention.
Figure 2B:
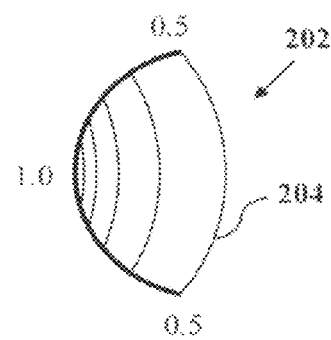
Figure 3:
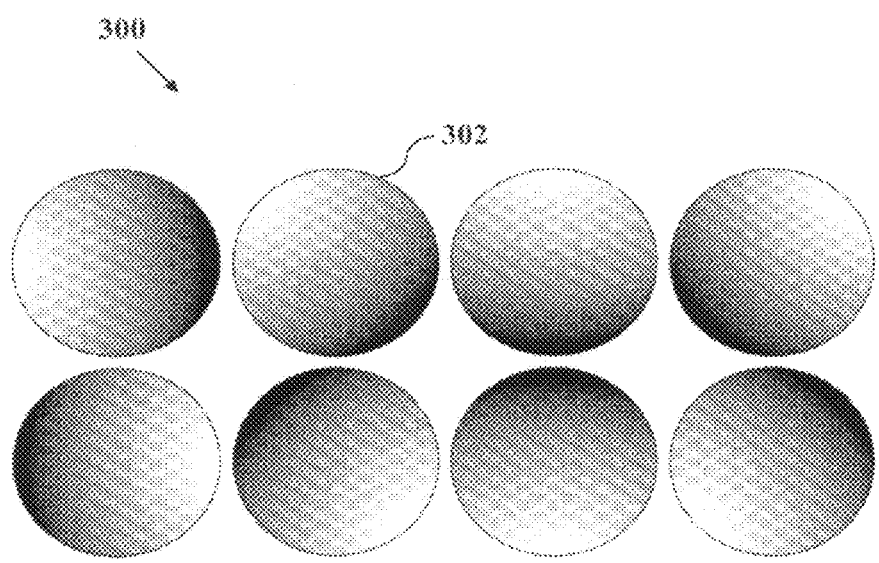
FIG. 3 illustrates coil sensitivity profiles for an array of coils according to an embodiment of the invention.
Figure 4:
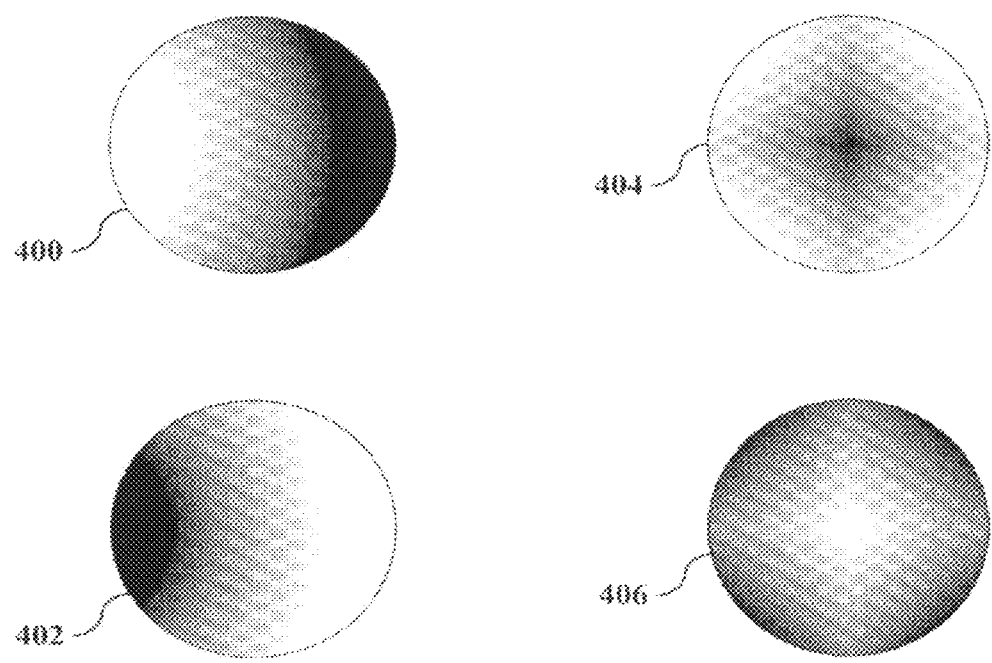
FIG. 4 illustrates four exemplary gradient functions complementary to an array of receiver coils according to an embodiment of the invention.

FIG. 2A illustrates a coil sensitivity profile 200 shaded to indicate spatial variation of sensitivity scaled from 0 to 1. Shown in FIG. 2B is a corresponding map 202 of isocontours for the profile 200. A complementary gradient profile would vary maximally along any given contour line, such as contour line 204. FIG. 3 is an illustration of a set 300 of sensitivity profiles for eight different coil elements in an eight-element phased array receiver coil. Each of the profiles, such as profile 302, has a different spatial orientation, and the sensitivities sum to form a net profile that approximates a circularly symmetric profile. The corresponding coil array is positioned circumferentially around the imaging region. FIG. 4 illustrates an example of four ideal NSI gradients, 400, 402, 404, 406, which could be selected as being complementary to an array of receiver coils. The NSI method may be scaled to include any number of gradient shapes. Each of the gradients in a set would be used as dephase/rephase readout gradients. The physically realizable gradients are selected to closely approximate the ideal complementary gradients. In a preferred embodiment, the set of physically realizable gradients are spherical harmonics. A gradient apparatus as designed from the inventive method may be broadly substituted in commercial systems with a minimum of modification. Commercial medical systems are commonly employed in diagnosis of injury, perfusion, neurological function, and cancer.

TABLE 1

Spherical harmonic shim function formulae up to third order.

| l | m  | Shim Name   | $f_m^l(x, y, z)$       |
|---|----|-------------|------------------------|
| 1 | 0  | Z           | z                      |
| 1 | 1  | X           | x                      |
| 1 | -1 | Y           | y                      |
| 2 | 0  | $Z^2$       | $z^2 - (x^2 + y^2)/2$  |
| 2 | 1  | ZX          | zx                     |
| 2 | -1 | ZY          | zy                     |
| 2 | 2  | $X^2 - Y^2$ | $x^2 - y^2$            |
| 2 | -2 | XY          | 2xy                    |
| 3 | 0  | $Z^3$       | $z^3 - 3x(x^2 + y^2)/2$ |
| 3 | 1  | $Z^2X$      | $z^2x - x(x^2 + y^2)/2$ |
| 3 | -1 | $Z^2Y$      | $z^2y - y(x^2 + y^2)/4$ |
| 3 | 2  | $Z(X^2 - Y^2)$ | $z(x^2 - y^2)$      |
| 3 | -2 | ZXY         | zxy                    |
| 3 | 3  | $X^3$       | $3x^3 - 3xy^2$         |
| 3 | -3 | $Y^3$       | $3x^2y - y^3$          |

Given a set of receiver coils, a set of coil profiles is determined. These receive coil sensitivities may be generated from known analytical expressions for the magnetic field of the coils. Microstrip coils, for example, have known analytical expressions, feature excellent decoupling, spatial phase variation, and flexibility in placement.

Each receive coil collects signal simultaneously with other coils. The individual coil sensitivity profiles modulate the spin density signal, leading to differentiation between spatial locations. The signal equation for a receive coil tuned to the Larmor frequency and a nonlinear magnetic gradient perturbation is $$S_{l,t} = \int \rho(r) C_l(r) e^{-i2\pi\gamma G_m(r)t} dr,$$

where $\rho(r)$ represents the spin density at location r, $C_l(r)$ is the sensitivity of coil l at location r, $G_m(r)$ is the magnetic gradient shape applied at location r during an echo, t is time, and $\gamma$ is the gyromagnetic ratio for the proton. Using the index n to sum over a discrete space, we can approximate the above integral to obtain $$S_{l,t} = \sum_n \rho_n C_{l,n} e^{-i2\pi\gamma G_{m,n} t}.$$

Each coil generates a signal for every sampled time point t. The general encoding matrix expresses discrete physical observations with receive coils and applied gradients. Defining $$B_{l,m,t,n} = C_{l,n} e^{-i2\pi\gamma G_{m,n} t},$$

we then substitute in the above sum to obtain $$S_{l,t} = \sum_n \rho_n B_{l,m,t,n}.$$

The rows are grouped by echo (gradient shape) and cycled through the receive coils.

The gradients are designed perpendicular to the coil profiles in order to provide complementary encoding information, i.e., gradients vary where coil sensitivities are flat. This orthogonality constraint specifies that the dot product between coil sensitivity and encoding shape is zero. Furthermore, gradients should encode independent information by being orthogonal. In matrix formalism, we can express these key principles as follows:

$$C_l \cdot G_m = 0 \text{ for all } l, m$$

$$G_i \cdot G_j = \delta_{ij} \text{ for all } i,j \text{ from 1 to } M$$

where $\delta_{ij}$ is the Kronecker delta and $G_m$ has components $e^{-i2\pi\gamma G_{m,n} t}$. Inspecting the constraint for one encoding shape m gives the following.

$$\begin{bmatrix} c_{11} & c_{12} & \cdots & c_{1N} \\ c_{21} & \ddots & & \vdots \\ \vdots & & & \\ c_{L1} & \cdots & & c_{LN} \end{bmatrix} \begin{bmatrix} g_1 \\ g_1 \\ \vdots \\ g_N \end{bmatrix} = 0.$$

The equation above is for one encoding shape m that is orthogonal to all L coil profiles. In order to find gradients that are orthogonal to coil profiles, we find the vectors that are mapped to zero when acted on by the above coil sensitivity matrix C. The singular value decomposition (SVD) theorem states that a matrix can be decomposed into two unitary matrices U and V (rotations) and a diagonal matrix S (scaling):

$$C = USV^H$$

Consequently, it provides a complete set of orthogonal vectors that are a subset of the vectors in V.

$$V_0 = V_{:,L+1:N}$$

Here $V^H$ denotes the transpose conjugate of V. The colon in the subscript on the right denotes selection of columns in the matrix V, and the L+1 refers to the selection of only the vectors after the L vectors representing the coil information, i.e., those that correspond to the coil null space, where L is defined above as the number of coils. Thus, $V_0$ contains the vectors that have a zero dot product with the coil profiles. $V_0$ spans a linear space, and vectors in $V_0$ are not a unique basis set for the vectors that are orthogonal to the coil profiles. In order to generate gradient shapes, the vectors are interpreted as gradients. The orthogonality constraint along with the SVD design ensures individual encoding shapes satisfy the following:

$$C_l \cdot e^{-i2\pi\gamma G_m t} = 0$$

$$\phi[C_l \cdot e^{-i2\pi\gamma G_m t} = 0]$$

The phase of the equation has been taken, i.e., the phase of the complex numbers on each side of the equation are equal.

In the case of pulsed gradients, the gradient shapes are time-invariant during the application of the pulse. Combining the SVD analysis with the orthogonality relation yields the gradient shapes given by $$G_\perp = \phi(V_0) = \arctan\left(\frac{\text{Im}[V_0]}{\text{Re}[V_0]}\right).$$

The resulting analysis produces N-K encoding functions, where N is the total number of pixels in the image, K is the total number of gradient shapes desired. K may only be greater than or equal to L, where L is the number of coils.

The set of orthogonal gradients are summarized to a concise set for imaging. Casting the set of orthogonal gradients as a linear operator sets the formalism to consider the range space of encoding action.

The set of gradients form the encoding matrix for imaging with uniform coil sensitivity. With an SVD, the range space of the gradients can be expressed in an orthogonal basis.

$$G_\perp = W\Xi X^H.$$

A set of gradients $G_m$ is selected from the range space, which are the columns from the SVD:

$$G_m = W_{:,m} \text{ for } m=1,2,\ldots,K$$

where the colon refers to the rows in W.

Here K gradients are chosen depending on the desired reduction factor, R. In practice, the SVD can be computationally intense for the large N×N matrix (e.g., for a 256×256 image, N×N has nearly 4.3 billion elements). A fast SVD method known as the Lanczos SVD provides orthogonal eigenvectors corresponding to singular values using reorthonormalization. Few gradients are required for high acceleration (R>8) where the Lanczos SVD is highly accurate. Each gradient is used as a readout gradient in any spin-echo or gradient-echo sequence.

For physically realizable gradients, a set of in-plane spherical harmonics approximates the gradients in G with a least squares fit. The gradients lying in the range space contain sharp field transitions that cannot be easily formed. Spherical harmonics, well-implemented magnetic fields, may approximate the ideal gradient fields. For approximation, the nondegenerate in-plane spherical harmonics up to second order were used. For theoretical consideration as many fields as available may be arranged in Y to generate a least squares fit.

$$G=Yw$$

where w is a vector of weighting coefficients used in the least squares fit. The spherical harmonic shapes Y are combined with different weights to approximate the ideal gradient shapes in G:

$$w=(Y^T Y)^{-1} Y^T G.$$

For present discussion, spherical harmonics up to the second order would confer significant improvements over traditional parallel imaging.

Once the set of ideal NSI gradients are generated with the characteristics as determined according to the procedure outlined above, combinations of realizable spherical harmonics are used to approximate ideal encoding functions. Nonlinear encoding functions composed of spherical harmonics through second order provide an efficient and novel image acquisition method with performance much higher than current state-of-the-art imaging with linear gradients.

The efficient gradient encoding scheme uses a spin echo sequence or a gradient echo sequence with dephase and rephase lobes for each nonlinear gradient from the set. The encoding gradient shape changes from echo to echo with each echo collected using a different readout gradient from the NSI set of gradients. Image reconstructions may be performed using the Kaczmarz iterative algorithm.

Since NSI does not employ conventional phase encoding, the data do not reside in k-space, and a straightforward 2D Fourier Transform reconstruction approach cannot be used. Each echo represents a projection of the object along is 0 frequency contour lines of the particular nonlinear read gradient that is used for that echo. Subsequent echoes are collected with a different nonlinear gradients used as a readout for each echo. This represents a complex nonlinear projection reconstruction problem.

One solution to the reconstruction problem is to formulate the acquisition as a matrix equation and to solve the equation using a frequency domain algorithm based on the to echoes.

The Kaczmarz iterative projection algorithm solves the integral equation s=Aρ in the frequency (echo) domain. The Kaczmarz iterative projection algorithm, also known as the Algebraic Reconstruction Technique (ART), is a row-action method that has found application in computed tomography and cryo-electron microscopy. This algorithm compares each echo time point with the inner product of the appropriate row of the projection matrix, denoted $a_{m,n,t}$ with the n-th iterate of the image estimator. The difference between these scalars weights the amount of basis function $a_{m,n,t}$ which is added to the estimator going into the next iteration:

$$\hat{\rho}_{n+1} = \hat{\rho}_n + \lambda \frac{s_{m,l,t} - \langle a_{m,l,t}, \hat{\rho}_n \rangle}{\|a_{m,l,t}\|^2} a_{m,l,t}^*.$$

With second order approximation, high quality reconstruction is provided under increasing acceleration, noise, and sampling. A notable strength of the NSI approach is the ability to oversample in the readout direction with increased encoding gradient strength. Prior art approaches gain no benefit from oversampling as the sampling rate is fixed by the Nyquist sampling relation in the read-out direction. The NSI method demonstrates superior reconstruction at high accelerations compared to the prior art approach of SENSE.

An apparatus implementing the techniques of the present invention may take the form of a gradient insert coil with second order spherical harmonic terms that sits inside the clear bore of existing commercial MRI scanners. Another embodiment would be to replace the body coil in current scanners that contains only x, y, and z linear gradient terms, with a coil that contains all first and second order spherical harmonics. Either manifestation would yield highly efficient accelerated data acquisitions in 2D or 3D imaging.

With a straight-forward spin echo or gradient echo pulse sequence, a general receive-coil-tailored nonlinear gradient encoding procedure is provided for multi-fold accelerated MRI. The efficient gradient encoding analysis has features of being either an on-line or offline calculation performed for data from each coil in an array. The gradients used to spatially encode the image represent an increase in the amount of image information collected per echo and provide spatial information complementary to that produced by the receiver coils. With a more efficient data collection process, a higher quality image is generated with an equivalent amount of time.

The shift to high resolution accelerated scanning imposes increased performance demands on the gradient system. Second order spatial encoding gradients that have the strength, slew rate, and functional purity to image to specifications needed clinically are technically feasible. More optimal gradient sets would include spherical harmonics up to even higher orders as the ability to approximate ideal encoding gradients is improved if third, fourth, and even higher-order spherical harmonics are included in the proposed gradient sets.

With any gradient set built from spherical harmonics, three-dimensional imaging becomes a natural extension. The spherical harmonics are orthogonal and form a complete basis set within a spherical volume, and therefore nicely approximate three-dimensional functions quite well. To determine the gradient set the SVDs would be performed on a tensor, a three-dimensional matrix, or a vector with indices over a three-dimensional space.

Tailoring gradient functions to coil sensitivities opens possible synergies with receive coils for specific organs or anatomies. In some cases, resolution would be desired in a localized region and constraints would be imposed on the method to boost area-specific resolution. Different patterns and combinations of coils as inputs to the encoding function design may be a method to boost image quality in a region. In any case, designing encoding fields complementary to coil sensitivities creates a powerful data acquisition method to accelerate parallel imaging.

The invention claimed is:
1. A method of parallel magnetic resonance imaging comprising:
   a) sequentially and separately generating magnetic gradient encoding fields in an imaging region;
   b) sequentially acquiring echo data representing signal intensities;
   c) computing a reconstructed image from the acquired echo data; and
   d) displaying the computed image;
   wherein the sequentially acquired echo data corresponds to the sequentially generated magnetic gradient encoding fields;
   wherein multiple receiver coils are used to simultaneously acquire echo data at each instant in time;
   wherein the multiple receiver coils have corresponding nonuniform receiver coil sensitivity profiles;
   wherein the magnetic gradient encoding fields are nonlinear spatial gradient fields that are solutions to the Laplace equation; and
   wherein the magnetic gradient encoding fields approximate ideal gradient field shapes that are optimally complementary to spatial information provided by the receiver coil sensitivity profiles.

2. The method of claim 1 wherein the magnetic gradient encoding fields approximate ideal gradient field shapes that optimally encode information residing in the null space of the coil sensitivity profiles.

3. The method of claim 1 wherein the magnetic gradient encoding fields are spherical harmonic functions or free disk harmonic functions.

4. The method of claim 1 wherein the magnetic gradient encoding fields are mutually orthogonal.

5. The method of claim 1 wherein the reconstructed image is computed using a set of linear equations relating the receiver coil sensitivity profiles, the magnetic gradient encoding fields, and acquired echo data.

6. The method of claim 1 wherein the reconstructed image is computed using an algebraic reconstruction technique.

7. The method of claim 1 wherein the magnetic gradient encoding fields are a least-squares approximation to the ideal gradient fields.

* * * * *